(12) United States Patent
Zhou et al.

(10) Patent No.: US 10,826,450 B2
(45) Date of Patent: Nov. 3, 2020

(54) HYBRID CONCURRENT AND SWITCHED DUAL-BAND LOW NOISE AMPLIFIER

(75) Inventors: Lin Zhou, Chapel Hill, NC (US); Shih Mo, Milpitas, CA (US)

(73) Assignee: HuWoMobility, Inc., Milpitas, CA (US)

(*) Notice: Subject to any disclaimer, the term of this patent is extended or adjusted under 35 U.S.C. 154(b) by 0 days.

(21) Appl. No.: 11/736,446

(22) Filed: Apr. 17, 2007

(65) Prior Publication Data
US 2008/0258817 A1    Oct. 23, 2008

(51) Int. Cl.
*H03F 3/04* (2006.01)
*H03G 1/00* (2006.01)

(52) U.S. Cl.
CPC .................. *H03G 1/0023* (2013.01)

(58) Field of Classification Search
USPC ........................ 330/278, 302, 310, 311, 51
See application file for complete search history.

(56) References Cited

U.S. PATENT DOCUMENTS

| | | | | |
|---|---|---|---|---|
| 4,028,629 A * | 6/1977 | Ringland | | 330/2 |
| 7,102,444 B2 * | 9/2006 | Shanjani et al. | | 330/295 |
| 7,113,744 B1 * | 9/2006 | Moloudi et al. | | 455/20 |
| 7,323,939 B2 * | 1/2008 | Han et al. | | 330/311 |
| 7,352,247 B2 * | 4/2008 | Oh et al. | | 330/311 |

* cited by examiner

*Primary Examiner* — Henry K Choe
(74) *Attorney, Agent, or Firm* — HuWoMobility, Inc.

(57) ABSTRACT

The present invention provides a system and method for operating hybrid concurrent and switched dual-band low noise amplifiers. Embodiments use a concurrent design at the input block of a hybrid LNA to advantageously achieve better impedance matching while using a switch capacitor design at the output block to advantageously achieve a better gain than typical concurrent multiband LNAs. Embodiments might be integrated into wireless devices configured to simultaneously receive on multiple frequency bands while providing gains of 30 dB or more by combining the advantages of concurrent multiband LNAs with the advantages of switched multiband LNAs. In addition to the higher gains provided by embodiments of the hybrid LNA described herein, hybrid multiband LNAs according to embodiments of the present invention provide a smaller device footprint and power requirements than would be required for a receiver including multiple single-band LNAs for amplifying signals for each frequency band individually.

18 Claims, 3 Drawing Sheets

HYBRID CONCURRENT AND SWITCHED DUAL-BAND LOW NOISE AMPLIFIER

BACKGROUND OF THE INVENTION

The present invention relates generally to wireless communications and in particular to multiband low-noise amplifiers.

Low-noise amplifiers (LNAs) are a type of amplifier used in wireless communication systems amplify weak signals captured by one or more antennas. These systems may include, for example, wireless network systems, mobile phone systems, satellite systems, etc. LNAs play a crucial role in the reception of wireless signals, because the LNAs boost weak signals received by the one or more antennas to a desired signal strength. A LNA is often the first stage of processing that a signal may pass through after being received by an antenna. Therefore, it is crucial that the LNA boost signal strength while introducing as little noise into the system as possible, because any noise introduced into the signal by the LNA will be passed on to all subsequent stages of processing.

Dual-band LNAs have been developed for use in wireless devices that operate on multiple frequency bands as an alternative to single-band LNAs that are configured to operate on a single frequency band. A wireless device using single-band LNAs would require a single-band LNA for each frequency band upon which the wireless device could operate. By replacing single-band LNAs with dual-band LNAs that can receive on multiple frequency bands, the total amount of circuitry needed to implement the amplifier for the receiver can be reduced. Furthermore, significant power savings might also be realized by replacing multiple single-band LNAs with a dual-band LNA. For mobile wireless devices operating from battery power, such as laptops, mobile phones, and other portable wireless devices, managing power consumption is crucial for extending battery life, and using dual-band LNAs to amplify wireless signals might significantly contribute to improving battery life of the wireless device.

Dual-band LNAs might be used to provide signal amplification for wireless receivers incorporated into various wireless devices that operate on multiple frequency bands. For example, a dual-band LNA may be incorporated into a wireless device operating in a mixed-mode wireless network where wireless devices are transmitting and/or receiving signals using different protocols that use different frequency bands for communication. For instance, a dual-band LNA might be incorporated into the receiver of a wireless device used in a mixed-mode network where some wireless devices in the mixed-mode wireless network implement the IEEE 802.11a standard, which uses the 5 GHz frequency band, while other wireless devices in the mixed-mode network implement the IEEE 802.11b/g standards, which use the 2.4 GHz frequency band. In order for the wireless device to be able to interoperate with the devices operating on these two different frequency bands, the device's receiver must be able to receive signals in both frequency bands. Accordingly, a dual-band LNA may be incorporated into the device's receiver in order to enable the receiver to receive and process signals from devices on both the 2.4 GHz and the 5 GHz frequency bands.

FIG. 1 is a block diagram illustrating a typical wireless receiver 100 incorporating a dual-band LNA. Wireless device 100 comprises: antenna 110, dual-band LNA 120, RF mixer 130, local oscillator 140, filter 150, demodulator 160, analog-to-digital converter 170, and signal outputs 180. The signals received by antenna 110 may be extremely weak. Therefore, dual-band LNA 120 is coupled to antenna 110, and signals received by antenna 110 are amplified by dual-band LNA 120 before being passed on to the rest of the stages of wireless receiver 100 for processing. Since dual-band LNA 120 is altering the incoming signal, it is crucial that dual-band LNA 120 introduce as little noise into the signal as possible while boosting the strength of the input signal.

Various types of multiband LNAs are known to the art, and the type of multiband LNA included in a particular wireless receiver might be determined by the desired functionality of the wireless receiver. Each type of multiband LNA has certain advantages and/or disadvantage that may limit the use of that type of multiband LNA to certain types of wireless receivers.

Two types of multiband LNAs that are typically used in wireless receivers are concurrent multiband LNAs and switched multiband LNAs. Concurrent multiband LNAs are configured for processing signals on multiple frequency bands simultaneously, while switched multiband LNAs are configured to select only a single frequency band from a plurality of frequency bands for processing. An advantage of concurrent multiband LNAs is that the concurrent multiband LNA can provide amplification of signals on multiple frequency bands at the same time. However, as a result, the overall gain in signal strength produced by concurrent multiband LNAs is generally limited to less than 20 dB (decibels) or less. In contrast, switched multiband LNAs are limited to processing a single frequency bandwidth at a time and incorporate a switch for selecting a particular frequency bandwidth from a plurality of frequency bandwidths. However, because switched multiband LNAs are configured to process a narrower bandwidth associated with a single frequency band, switched multiband LNAs typically can produce much higher gains for signals within the selected frequency band.

Concurrent multiband LNAs provide the advantage that they may process signals on multiple frequency bands simultaneously unlike switched multiband LNAs, which select only a single frequency band for processing at a time. Concurrent band LNAs might be most appropriate for use in wireless devices where the receiver must configured to receive on multiple frequency bands simultaneously. For example, a concurrent band LNA might be integrated into a receiver of wireless device for use in mixed-mode wireless network that includes devices operating using the IEEE 802.11a standard, and devices operating using the IEEE 802.11b/g standards. Devices using the 802.11a standard transmit using the 2.4 GHz frequency band, and devices using the 802.11b/g standards transmit using the 5 GHz frequency band. In order for the device to be able to receive communications from devices using 802.11a and 802.11b/g simultaneously, a concurrent band LNA configured to operate at both 2.4 GHz and 5 GHz could be used to boost signals received from the wireless devices' antenna.

Because concurrent multiband LNAs process signals in multiple frequency bands, concurrent multiband LNAs provide multiple regions of gain. Concurrent multiband LNAs are generally limited to a gain of less than 20 dB (decibels). FIG. 2 is a plot of frequency (in gigahertz) versus gain (in decibels) for a typical concurrent multiband LNA configured to process signals over two frequency bands. Two peaks in graph (210 and 220) indicate the two frequency bands that the concurrent multiband LNA is configured to receive. For example, for a concurrent multiband LNA integrated into a wireless receiver configured to receive 802.11a and 802.11b/g signals, peak 210 would represent the gain for the 2.4 GHz frequency band and peak 220 would represent the gain for the 5 MHz frequency band.

In a typical concurrent multiband LNA, as the bandwidth of the LNA increases, the gain decreases. As a result, the amplification for each of the individual frequency bands may not be as good as what might be achieved by a single-band LNA configured to process signals over a narrower bandwidth. Therefore, while a multiband LNA may eliminate the need for an individual single-band LNA for each frequency band to be received by a receiver, the signal quality produced by the multiband LNA for each frequency band may not be as good as the signal that would be produced by separate single-band LNAs configured for use with each individual frequency band.

In contrast to concurrent band LNAs that are configured to process signals on multiple frequencies simultaneously, switched multiband LNAs are configured to process a single frequency band at a time. Switched multiband LNAs include a switch that enables the LNA to select a particular frequency band for processing. Since switched multiband LNAs only process a single frequency band at a time, switched multiband LNAs might not be appropriate for use in receivers of wireless devices that need to be able to receive on multiple channels at the same time. However, an advantage of switched multiband LNAs is that the switched LNA may provide higher gain on each individual frequency band than would be provided by a concurrent band LNA. As a result, switched LNAs might provide wireless receivers with the ability to receive and process much weaker signals on a selected frequency band.

Because switched multiband LNAs process signals in a single frequency band, switched multiband LNAs provide a single region of gain. FIG. 3 is a plot of frequency versus gain for a switched multiband LNA wherein the switched multiband LNA is configured to select a lower-frequency frequency band from two frequency bands which the hybrid LNA is configured to process. Peak 310 represents the gain for the lower-frequency frequency band that the switched multiband LNA is configured to receive. Peak 320 represents the gain for a higher-frequency frequency band that the switched multiband LNA can also be configured to process instead of the lower-frequency band by reconfiguring the switched multiband LNA to select the higher frequency band.

Switched multiband LNAs might be most appropriately used in receivers of wireless devices where the wireless devices is configurable to receive on one of a plurality of frequency bands and the device does not need to receive on multiple frequency bands at the same time. For example, a switched multiband LNA might be included in the receiver of a mobile telephone that is configurable to operate on multiple mobile telephone networks operating at different frequencies. The mobile phone could be switched to operate at a first bandwidth, such as 800 MHz commonly used by some GSM mobile phone networks, or a second bandwidth, such as 1800 MHz that is also commonly used by other GSM mobile phone networks. Depending upon network availability, the switched multiband LNA could select the appropriate frequency band.

Impedance matching in switched multiband LNAs provides additional challenge to system designers using switched multiband LNAs in a receiver. The impedance of the various signal paths through the switched multiband LNA must match. Otherwise, signal loss and/or signal reflections that may further degrade signal quality might occur as a result of impedance mismatches.

As various new wireless standards are developed, the importance of a wireless receivers being able to receive wireless signals on multiple frequency bands will continue to grow. Accordingly, improved multiband LNAs that provide higher gain and yet can overcome challenges in impedance matching are needed.

BRIEF SUMMARY OF THE INVENTION

The present invention advantageously addresses the problems of the current low-noise amplifier systems described above by providing systems and methods for a hybrid concurrent and switched dual-band low noise amplifier.

According to an embodiment of the present invention, an apparatus for amplifying signals is provided. The apparatus includes a concurrent band input stage, an intermediate stage, a switched capacitance stage, and a variable gain stage. The concurrent band input stage includes a passive inductance capacitance network having at least one inductor and at least one capacitor. The concurrent band input stage is configured to receive an input signal from a signal source and to provide input impedance over at least a first and second frequency band. The intermediate stage is coupled to the concurrent input stage and is operable to provide amplification for the input signal. The intermediate stage is configured to produce an output signal that is a amplified version of the input signal. The switched capacitance stage is also coupled to the intermediate stage. The switched capacitance stage includes at least one capacitor coupled to a switch to provide controllably added capacitance to the intermediate stage. The switched capacitance stage has at least a first position associated with operation over the first frequency band and at least a second position associated with operation over the second frequency band. The variable gain stage is coupled to the intermediate stage and is operable to receive a gain signal to control a level of gain associated with amplification provided by the intermediate stage.

According to another embodiment, a method for amplifying signals is provided. The method includes the steps of operating a concurrent band input stage, operating an intermediate stage, operating a switched capacitance stage, operating a variable gain stage. The intermediate stage produces an output signal representing an amplified version of the input signal. The concurrent band input stage includes a passive inductance and capacitance network having at least one inductor and at least one capacitor. The step of operating the concurrent band input state includes receiving an input signal from a signal source and providing input impedance over at least a first and a second frequency band. Furthermore, the intermediate stage is coupled to the concurrent input stage to provide amplification for the input signal. The switched capacitance stage is also coupled to the intermediate stage. The switched capacitance stage comprises at least one capacitor coupled to a switch to provide controllably added capacitance to the intermediate stage, the switched capacitance stage having at least a first position associated with operation over the first frequency band and at least a second position associated with operation over the second frequency band. The variable gain stage is also coupled to the intermediate stage and is configured to receive a gain signal and control a level of gain associated with amplification provided by the intermediate stage.

Other features and advantages of the invention will be apparent in view of the following detailed description and preferred embodiments.

BRIEF DESCRIPTION OF THE DRAWINGS

Embodiments of the invention are described here, with reference to the figures. Where elements of the figures are called out with reference numbers, it should be understood that like reference numbers refer to like elements and might or might not be the same instance of the element.

DETAILED DESCRIPTION OF THE INVENTION

The present invention provides a hybrid concurrent and switched dual-band low noise amplifier. Embodiments of the present invention use a concurrent design at the input block of the hybrid LNA to advantageously achieve better impedance matching while using a switch capacitor design at the output block to advantageously achieve a better gain than typical concurrent multiband LNAs.

Embodiments of the present invention may be included in wireless devices configured to simultaneously receive on multiple frequency bands while providing gains of 30 dB or more by combining the advantages of concurrent multiband LNAs with the advantages of switched multiband LNAs. In addition to the higher gains provided by embodiments of the hybrid LNA described herein, hybrid multiband LNAs according to embodiments of the present invention provide a smaller device footprint and power requirements than would be required for a receiver including multiple single-band LNAs for amplifying signals for each frequency band individually. Embodiments of the present invention may advantageously achieve gains of approximately 30 dB or more while maintaining a low noise threshold.

Figure 4:
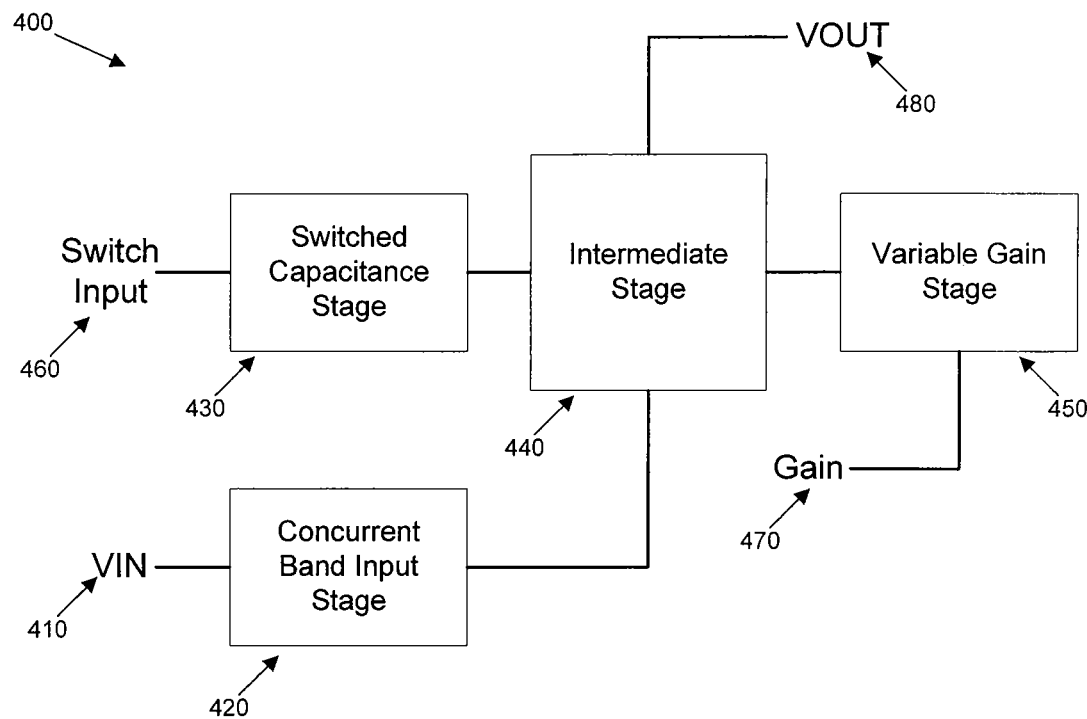
FIG. 4 is block diagram of a low-noise amplifier according to an embodiment.

FIG. 4 is block diagram of a hybrid low-noise amplifier 400 that may be incorporated into a wireless receiver according to an embodiment. Low-noise amplifier 400 is a multistage amplifier comprising concurrent-band input stage 420, switched capacitance stage 430, intermediate stage 440, and variable gain stage 450. Hybrid LNA 400 receives a signal input 410 at concurrent band input stage. In some embodiments, hybrid LNA 400 may receive signal input 410 directly from an antenna of the wireless receiver, while in other embodiments the input signal 410 may be processed by a filter or other components before being passed to hybrid LNA 400.

Signal 410 may comprise multiple frequency bands. Concurrent band input stage 420 enables hybrid LNA 400 to switch from amplifying one frequency band to another while advantageously avoiding impedance mismatching problems that must be overcome in typical switched capacitance multiband LNAs. While concurrent band input stage 420 receives input signal 410, concurrent band input stage 420 does not select of the frequency band to be amplified by hybrid LNA 400. Instead, switched capacitance stage 430, which is discussed in more detail below, selects the frequency band from signal 410 to be amplified.

Concurrent band input stage 420 advantageously avoids the impedance mismatch problems presented by typical switched capacitance multiband LNAs. Impedance mismatches can result in signal loss and/or signal reflections that can result in a poor quality output signal 480. Accordingly, avoiding impedance mismatches is crucial for optimal LNA and receiver performance. As a result of the hybrid design disclosed herein, the design of a receiver including hybrid LNA 400 may be greatly simplified in comparison to a receiver including a typical switched capacitance multiband LNA, because concurrent band input stage 420 of hybrid LNA 400 does not include a switch for selecting a signal path, hybrid LNA 400 and/or the receiver do not require additional circuitry typically used to overcome impedance mismatching.

The output of concurrent input stage 420 is fed into intermediate stage 440 for amplification. Intermediate stage provides for substantial amplification of the input signal and outputs the amplified output signal 480. Output signal 480 provides an amplified signal to later stages of processing of the wireless receiver into which hybrid LNA 400 integrated. Hybrid LNA 400 boost the signal strength for the frequency band of interest to the receiver while minimizing the noise introduced into the input signal by the amplifier.

Intermediate stage 410 is coupled to variable gain stage 450 and to switched capacitance stage 430 in order to provide control for amplification of the input signal. Variable gain stage 450 receives an gain input signal 470 which may be used to control, at least in part, the overall gain of output signal 480. The higher the overall gain, the higher the ratio of the output signal to the input signal. Overall gain is typically measured in decibels (dB). A hybrid LNA according to embodiments of the present invention might provide an overall gain of 30 dB or more. Variable gain stage 450 may be used to adjust the amount of gain of output signal 480 by increasing or decreasing gain input 470. According to some embodiments, increasing gain input 470 increases the gain of output signal 480, while in other embodiments, gain output signal may have an inverse affect on the gain of output signal 480 and increasing gain input 470 decreases the gain of output signal 480.

Intermediate stage 410 is also coupled to switched capacitance stage 450 and switched capacitance stage also controls, at least in part, signal output 480 of intermediate stage 440. Switched capacitance stage 450 provides controllably added capacitance to the intermediate stage. Switched capacitance stage 450 includes a switch having at least a first position associated with operation over a first frequency band and at least a second position associated with operation over a second frequency band. As a result, when the position of the switch of the switched capacitance stage 450 is in the first position, the capacitance associated with operation of intermediate stage 440 may be set for proper amplification over the first frequency band. When position of the switch is in the second position, the capacitance associated with operation of intermediate stage 440 may be set for proper operation over the second frequency band. Thus, the overall frequency response of hybrid LNA 400 may be changed by changing the position of the switch of the switched capacitance stage 450 via switch input 460.

Figure 1:
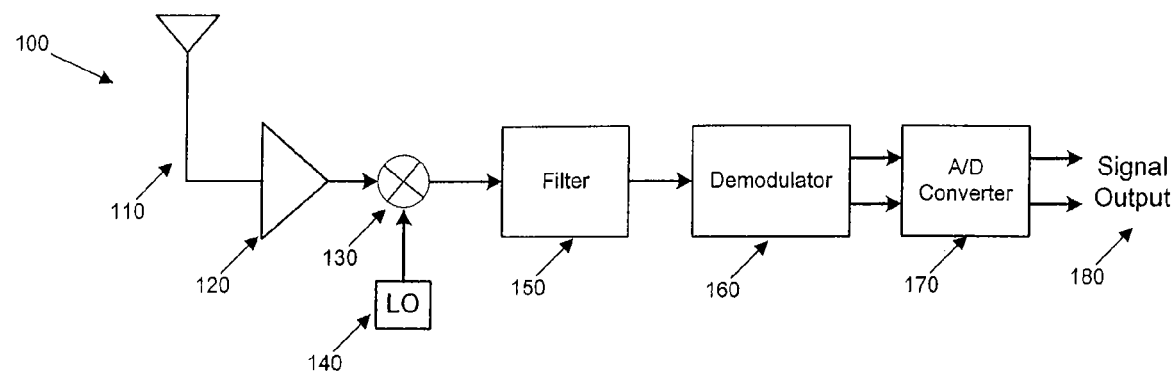
FIG. 1 is a block diagram of a wireless receiver incorporating a multiband LNA.
Figure 2:
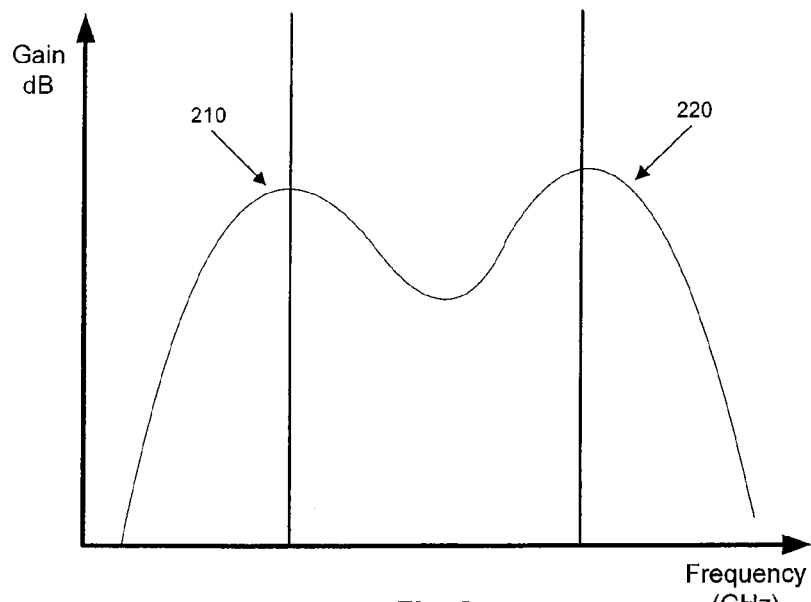
FIG. 2 is a plot of frequency versus gain for a concurrent band low-noise amplifier.
Figure 3:
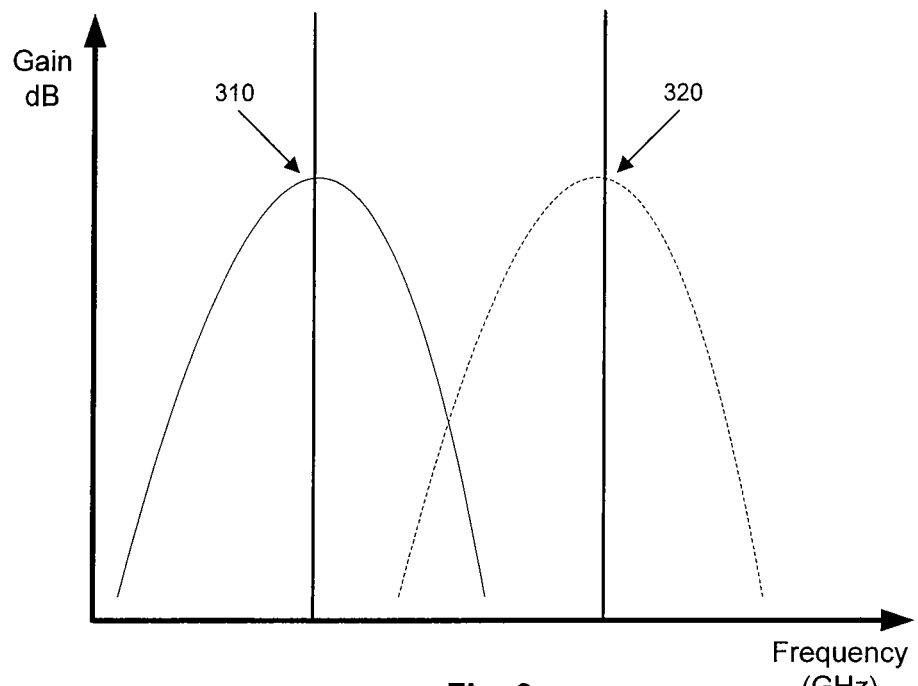
FIG. 3 is a plot of frequency versus gain for a hybrid low-noise amplifier according to an embodiment.

Hybrid LNA 400 thus combines the advantages of concurrent multiband LNAs and switched multiband LNAs. Concurrent band input stage 420 enables hybrid LNA 400 to achieve a consistent input impedance, regardless of the frequency band chosen. As a result, design of components interfacing with input stage 420 is dramatically simplified. Furthermore, switched capacitance stage 430 enables hybrid LNA 400 to selectively boost the gain for a particular frequency band by selectively adding capacitance. As a result, gains of 30 dB or higher may be achieved for different frequency bands. Referring back to FIG. 3, hybrid LNA 400 produces a single region of gain similar to that produced by a switched multiband LNA illustrated in FIG. 3. For example, if switched capacitance stage 430 is configured to select a lower-frequency frequency band from two frequency bands which the hybrid LNA is configured to process, peak 310 represents the gain for the lower-frequency frequency band. Peak 320 represents the gain for the higher-frequency frequency band that the hybrid LNA can also be configured to process instead of the lower-frequency frequency band by reconfiguring switched capacitance stage 430 to select the higher-frequency frequency band. Variable gain stage 450 can then be used to adjust the overall gain of the signal across the selected frequency band before the signal is output by intermediate stage 440 as output signal 480.

Figure 5:
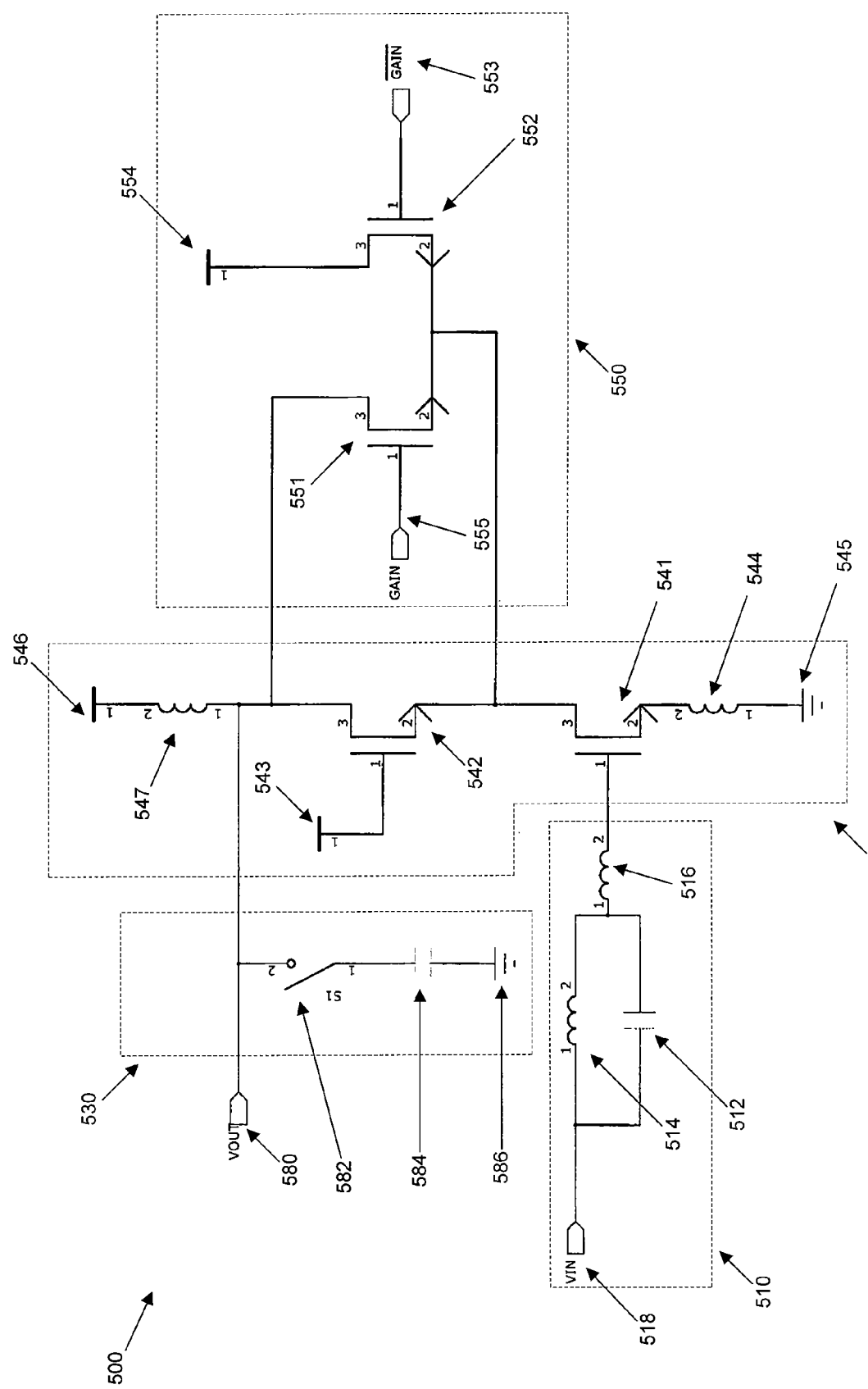
FIG. 5 is a circuit diagram of a low-noise amplifier according to an embodiment.

FIG. 5 is a circuit diagram of a hybrid LNA 500 according to an embodiment. Hybrid LNA 500 is configured to receive and amplify signals on two frequency bands. For example, circuit 500 may be an implementation of hybrid LNA 400 shown in FIG. 4. One skilled in the art will recognize that this embodiment is merely illustrative and that alternative embodiments may provide hybrid low-noise amplifiers.

Hybrid LNA 500 is a multistage amplifier comprising concurrent band input stage 510, switched capacitance stage 530, intermediate stage 540, and variable gain stage 550. Hybrid LNA 500 provides an implementation according to one embodiment of the present invention. One skilled in the art will recognize various implementations of the stages of LNA 500 are possible using different circuit configuration to achieve the same result.

Concurrent band input stage 510 comprises a passive inductance and capacitance network operable to receive an input signal 518 from a signal source and to provide input impedance over two frequency bands. While the embodiment depicted in FIG. 5 provides for amplification of signals on two frequency bands, other embodiments may provide for amplification of signals on more than two frequency bands.

Concurrent band input stage 510 comprises first input stage inductor 514 and second stage input inductor 516 and input stage capacitor 512. First input stage inductor 514 is connected in parallel with input stage capacitor 512, and first input stage inductor 514 and capacitor 512 are connected in series with second input stage inductor 516.

Intermediate stage 540 is coupled to concurrent band input stage 510 and receives the amplified input signal from the concurrent band input stage. Intermediate stage 540 comprises first intermediate stage transistor 541 and second intermediate stage transistor 542. Concurrent band input stage 510 is coupled to first intermediate stage transistor 541. First intermediate stage transistor 541 is also coupled to second intermediate stage transistor 542 and coupled to ground 545 though second intermediate stage inductor 544.

Switched capacitance stage 530 and variable gain stage 550 are coupled to second intermediate transistor 542. Intermediate stage transistor 542 is also coupled to intermediate stage voltage supply source 546 via first intermediate stage inductor 547.

Switched capacitance stage 530 comprises switch 582, capacitor 584, and ground 586. Switch 582, when closed, connects capacitor 582 to intermediate stage 540 and allows current to flow to ground 586, and when switch 582 is open, capacitor 582 is disconnected from the intermediate stage. Thus, the capacitance of the system may be adjusted by opening or closing switch 582. A first frequency band is associated with the open state of switch 582 and a second frequency band is associated with the closed state of switch 582. Switched capacitance stage 530 is coupled to output signal 580 of intermediate stage 540, switched capacitance stage 530 controls, at least in part, the gain at one or more frequency bands.

Variable gain stage 550 provides a means for controlling, at least in part, the gain of output signal 580. Variable input stage 550 comprises first gain stage transistor 551 and second gain stage transistor 552 arranged in a back-to-back configuration. First gain transistor 551 is coupled to first gain input 555 and intermediate stage 540. Second gain transistor 552 is coupled to second gain input 553 and to intermediate stage 540 as well. Second gain transistor 552 is also coupled to voltage supply 554. By adjusting voltage of first gain input 555 and second gain input 552, the gain of the signal output 580 of intermediate stage 540 can be increased or decreased. Here, second gain input 553 is the inverse of first gain input 555. Voltages supplies 543 and 546 are connected to the same voltage source. Also, ground 545 and ground 586 refer to the same ground.

According to an embodiment of the invention, circuit 500 is implemented using complimentary metal-oxide-semiconductor (CMOS) technology. In other embodiments, the invention may be implemented using other classes of integrated circuits, such as bipolar junction transistors (BJT), BiCMOS (an integration of bipolar junction transistors and CMOS) and/or integrated injection logic (IIL).

While the embodiments described above may make reference to specific hardware components, those skilled in the art will appreciate that different combinations of hardware and/or software components may also be used and that particular operations described as being implemented in hardware might also be implemented in software or vice versa.

Thus, although the invention has been described with respect to specific embodiments, it will be appreciated that the invention is intended to cover all modifications and equivalents within the scope of the following claims.

What is claimed is:
1. An apparatus for amplifying signals comprising:
a concurrent band input stage including a passive inductance and capacitance network having at least one inductor and at least one capacitor, the concurrent band input stage operable to receive an input signal from a signal source and provide input impedance over at least a first and a second frequency band;
an intermediate stage coupled to the concurrent input stage and operable to provide amplification for the input signal;
a switched capacitance stage coupled to the intermediate stage, the switched capacitance stage comprising at least one capacitor coupled to a switch to provide controllably added capacitance to the intermediate stage, the switched capacitance stage having at least a first position associated with operation over the first frequency band and at least a second position associated with operation over the second frequency band;
a variable gain stage coupled to the intermediate stage and operable to receive a gain signal to control a level of gain associated with amplification provided by the intermediate stage;
wherein the intermediate stage is operable to produce an output signal representing an amplified version of the input signal; and wherein the intermediate stage comprises a first and a second intermediate stage transistor arranged in a stacked configuration.

2. The apparatus of claim 1 wherein the concurrent band input stage is coupled to the first intermediate stage transistor.

3. The apparatus of claim 1 wherein the switched capacitance stage is coupled to the second intermediate stage transistor.

4. The apparatus of claim 1 wherein the variable gain stage is coupled to the second intermediate stage transistor.

5. The apparatus of claim 1 wherein the intermediate stage is coupled through a first intermediate stage inductor to a voltage supply source, and the intermediate stage is coupled through a second intermediate stage inductor to ground.

6. The apparatus of claim 1 wherein the concurrent band input stage comprises a first and a second input stage inductor and an input stage capacitor, and the first input stage inductor is connected in parallel with the input stage capacitor and connected in series with the second input stage inductor.

7. The apparatus of claim 1 wherein the switched capacitance stage is operable to (i) in the first position, close the switch to connect the at least one capacitor to the intermediate stage and (ii) in the second position, open the switch to disconnect the at least one capacitor from the intermediate stage.

8. The apparatus of claim 1 wherein the variable gain stage comprises a first gain stage transistor and a second gain stage transistor arranged in a back-to-back configuration.

9. The apparatus of claim 1
wherein the intermediate stage comprises a first and a second intermediate stage transistor arranged in a stacked configuration, the concurrent band input stage is coupled to the first intermediate stage transistor, the switched capacitance stage is coupled to the second intermediate stage transistor, and the variable gain stage is coupled to the second intermediate stage transistor;
wherein the intermediate stage is coupled through a first intermediate stage inductor to a voltage supply source, and the intermediate stage is coupled through a second intermediate stage inductor to ground;
wherein the concurrent band input stage comprises a first and a second input stage inductor and an input stage capacitor, and the first input stage inductor is connected in parallel with the input stage capacitor and connected in series with the second input stage inductor;
wherein the switched capacitance stage is operable to (i) in the first position, close the switch to connect the at least one capacitor to the intermediate stage and (ii) in the second position, open the switch to disconnect the at least one capacitor from the intermediate stage; and
wherein the variable gain stage comprises a first gain stage transistor and a second gain stage transistor arranged in a back-to-back configuration.

10. A method for amplifying signals comprising:
operating a concurrent band input stage including a passive inductance and capacitance network having at least one inductor and at least one capacitor, to receive an input signal from a signal source and provide input impedance over at least a first and a second frequency band;
operating an intermediate stage coupled to the concurrent input stage to provide amplification for the input signal;
operating a switched capacitance stage coupled to the intermediate stage, the switched capacitance stage comprising at least one capacitor coupled to a switch to provide controllably added capacitance to the intermediate stage, the switched capacitance stage having at least a first position associated with operation over the first frequency band and at least a second position associated with operation over the second frequency band;
operating a variable gain stage coupled to the intermediate stage, to receive a gain signal and control a level of gain associated with amplification provided by the intermediate stage;
wherein the intermediate stage produces an output signal representing an amplified version of the input signal; and
wherein the intermediate stage comprises a first and a second intermediate stage transistor arranged in a stacked configuration.

11. The method of claim 10 wherein the concurrent band input stage is coupled to the first intermediate stage transistor.

12. The method of claim 10 wherein the switched capacitance stage is coupled to the second intermediate stage transistor.

13. The method of claim 10 wherein the variable gain stage is coupled to the second intermediate stage transistor.

14. The method of claim 10 wherein the intermediate stage is coupled through a first intermediate stage inductor to a voltage supply source, and the intermediate stage is coupled through a second intermediate stage inductor to ground.

15. The method of claim 10 wherein the concurrent band input stage comprises a first and a second input stage inductor and an input stage capacitor, and the first input stage inductor is connected in parallel with the input stage capacitor and connected in series with the second input stage inductor.

16. The method of claim 10 wherein the switched capacitance stage (i) in the first position, closes the switch to connect the at least one capacitor to the intermediate stage and (ii) in the second position, opens the switch to disconnect the at least one capacitor from the intermediate stage.

17. The method of claim 10 wherein the variable gain stage comprises a first gain stage transistor and a second gain stage transistor arranged in a back-to-back configuration.

18. The method of claim 10,
wherein the intermediate stage comprises a first and a second intermediate stage transistor arranged in a stacked configuration, the concurrent band input stage is coupled to the first intermediate stage transistor, the switched capacitance stage is coupled to the second intermediate stage transistor, and the variable gain stage is coupled to the second intermediate stage transistor;
wherein the intermediate stage is coupled through a first intermediate stage inductor to a voltage supply source, and the intermediate stage is coupled through a second intermediate stage inductor to ground;
wherein the concurrent band input stage comprises a first and a second input stage inductor and an input stage capacitor, and the first input stage inductor is connected in parallel with the input stage capacitor and connected in series with the second input stage inductor;
wherein the switched capacitance stage (i) in the first position, closes the switch to connect the at least one capacitor to the intermediate stage and (ii) in the second position, opens the switch to disconnect the at least one capacitor from the intermediate stage; and wherein the variable gain stage comprises a first gain stage transistor and a second gain stage transistor arranged in a back-to-back configuration.

\* \* \* \* \*